United States Patent [19]
Gordon

[11] 3,964,320
[45] June 22, 1976

[54] ADAPTABLE TUNER ASSEMBLY

[75] Inventor: Frank John Gordon, Chicago, Ill.

[73] Assignee: Motorola, Inc., Schaumburg, Ill.

[22] Filed: May 2, 1975

[21] Appl. No.: 574,123

[52] U.S. Cl. ................................ 74/10.8; 74/384;
334/7
[51] Int. Cl.² ........................................ F16H 35/18
[58] Field of Search .................. 74/10.8, 384; 334/7

[56] References Cited
UNITED STATES PATENTS

| | | | |
|---|---|---|---|
| 2,875,629 | 3/1959 | Poorman | 74/384 |
| 3,832,908 | 9/1974 | Brewster | 74/10.8 X |

FOREIGN PATENTS OR APPLICATIONS

| | | | |
|---|---|---|---|
| 12186 | 5/1968 | Japan | 74/10.8 |

*Primary Examiner*—Paul L. Gensler
*Attorney, Agent, or Firm*—Margaret M. Parker; James W. Gillman

[57] ABSTRACT

The assembly has a tuning control shaft which is adjustable over a range of positions to conform to a range of tuner designs. An adjustable guide bracket for the manual tuning pinion gear allows the pinion gear to be positioned along a radius of the crown gear, allowing use of radially wider gear teeth on the crown gear. The clutch-declutch assembly is unaffected by movement of the pinion guide bracket and the entire tuner control and drive gear assembly is preassembled and preadjusted, then positioned with one locking nut.

7 Claims, 4 Drawing Figures

U.S. Patent June 22, 1976 3,964,320
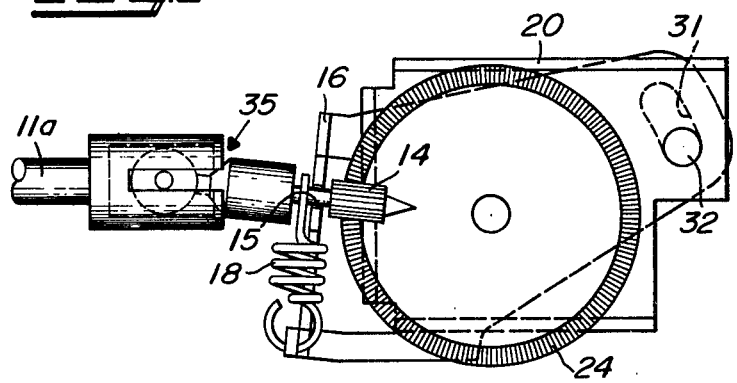
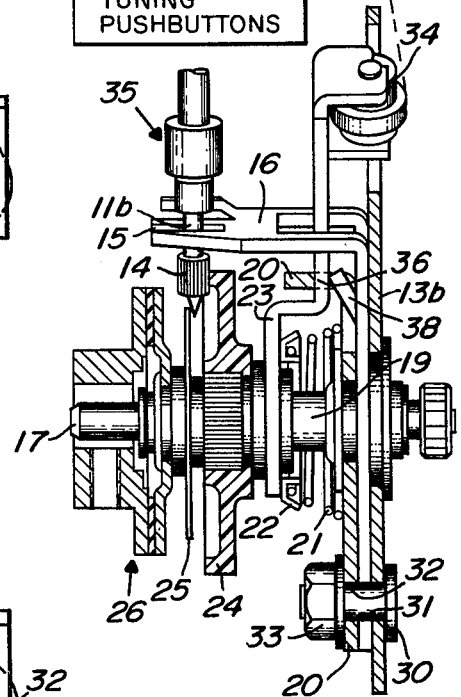
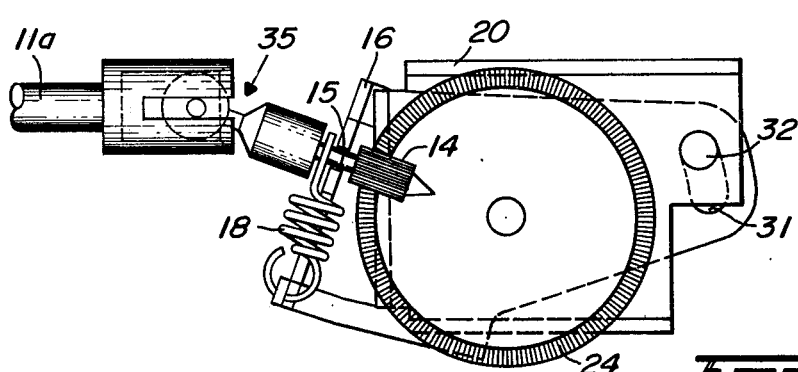
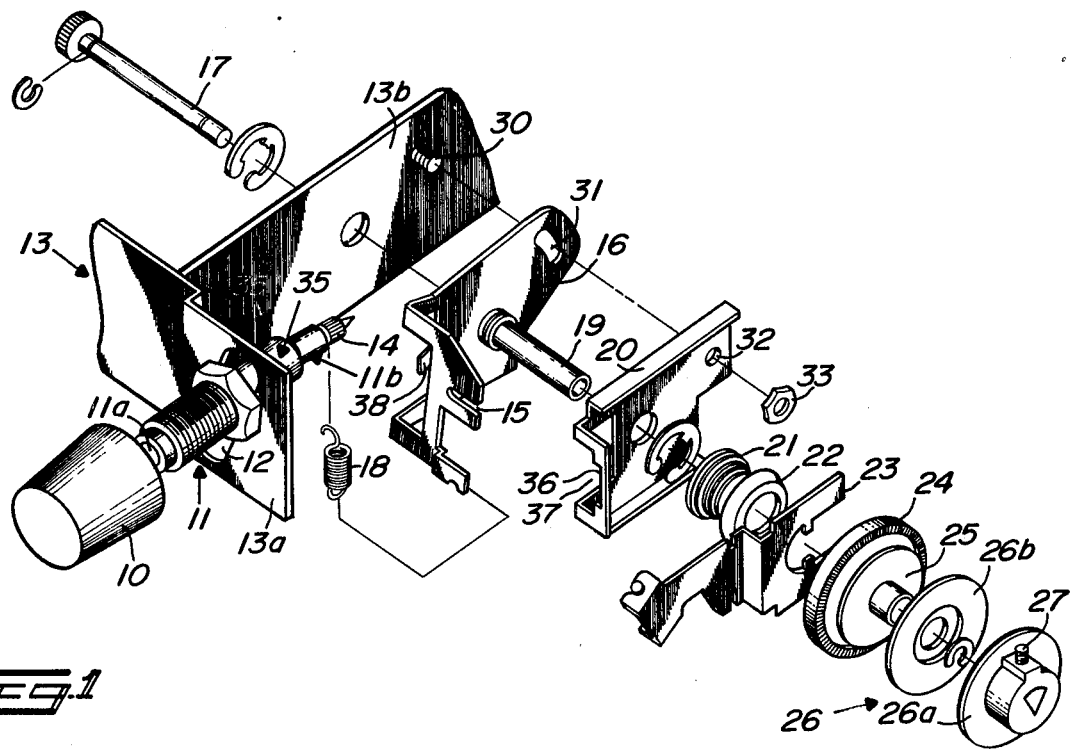

ADAPTABLE TUNER ASSEMBLY

BACKGROUND OF THE INVENTION

1. Field of the Invention

The present invention relates generally to the field of pushbutton radio tuners, and specifically to an improved tuning drive gear and clutch assembly, suitable for a range of front panel configurations.

2. Prior Art

In the past, a new tuner assembly was designed for each new radio design. When it becomes desirable to provide a tuner usable in a number of radio designs, compromises were made. Most common of these was making the position of the tuning knob shaft changeable without complete redesign of the tuner. This was typically accomplished by inserting some type of direction-changing device, such as a universal joint, in the tuner control shaft to allow the shaft position to be varied. This meant, however, that the support point of the pinion gear remained unchanged while its angular position moved. Since this created both cross-cutting and severe binding problems between the metal piece of the pinion gear and the resilient plastic of the crown gear, the next solution, i.e., making the teeth of the crown gear radially narrower, merely reduced gear binding at the cost of accelerated crown gear wear and eventual tuner drive failure.

As a corollary, it is advantageous to have the drive and clutch mechanism completely assembled and adjusted, and needing merely to be locked down and put into position at the time of tuner assembly.

SUMMARY

It is, therefore, an objective of this invention to provide a pre-adjustable, pre-assembled drive and clutch assembly for a radio tuner.

It is a specific objective to provide a tuner adaptable to a range of radio control panels.

It is a more specific objective to provide such a tuner while essentially eliminating drive gear wear.

According to the present invention, the above objectives are achieved by means of a tuner assembly having a first shaft means rotatably and slideably mounted on the support structure of the tuner, the shaft having a pivoting connection intermediate its ends for changing the direction of the axis of rotation of a first portion of the shaft relative to the axis of rotation of a second portion, and having the tuning control knob mounted on the second portion of the shaft. A second shaft which is also rotatably mounted on the support structure has a first gear fixedly mounted on one portion thereof. A second gear is fixedly mounted on the free end of the first portion of the first shaft for rotation therewith, and the second gear is adapted to cause rotation of the first gear. A guide bracket is pivotably mounted on the support structure and cooperates with the pivoting connection of the first shaft to position the axis of the second gear in radial alignment with the first gear.

BRIEF DESCRIPTION OF THE DRAWING

FIG. 1 is an exploded view of a manual tuning drive and clutch mechanism according to the invention, and shown in the environment of a radio tuner.

FIG. 2 is a partially cut away view of a portion of the embodiment of FIG. 1, shown assembled.

FIG. 3 is a partial plan view of the embodiment of FIG. 1, shown at one end of the range of adjustment.

FIG. 4 is a partial plan view as in FIG. 3, shown at the other end of the range of adjustment.

DETAILED DESCRIPTION OF THE INVENTION

Referring now more particularly to the drawing, a preferred embodiment is illustrated in FIGS. 1–4. The various components can best be identified in FIG. 1, beginning with a tuning knob 10 mounted on a first portion 11a of a shaft 11 to enable rotation of the shaft when manual tuning is desired. The first shaft portion 11a is slideably and rotatably mounted via an elongated slot 12 in a front portion 13a of the tuner support structure 13 (partially shown). On a second portion 11b of the shaft 11 is fixedly mounted a manual tuning pinion gear 14. The second portion 11b of the shaft 11 is supported by a slot 15 in a pinion gear support bracket 16 which is pivotably mounted on a portion 13b of the support structure. The shaft portion 11b is biased against a side of the slot 15 by a coil spring 18. The complete function of the bracket 16 will be discussed hereinafter.

Surrounding the shaft 17 is a bushing 19 which is fixedly attached to the bracket 16. The bushing supports a clutch release lever bracket 20, a biasing spring 21, a cup washer 22, a clutch release lever 23, a crown gear 24, a tension disc 25 for the pinion gear 14 and the inner portion 26b of a clutch mechanism designated generally as reference numeral 26 and operating to couple the rotation of the manual tuning knob 10 to the shaft 17 which, in turn, activates the mechanism (not shown) which tunes the receiver circuitry (not shown). Only the outer part 26a of the clutch mechanism 26 is mounted directly on the shaft 17 for rotation therewith, being affixed by a set screw 27. The bracket-bushing combination 16, 19 is supported on the portion 13b of the support structure 13. A screw 30 passes through the portion 13b, a slot 31 in the adjustable bracket 16, a hole 32 in the bracket 20 and mates with a nut 33, to prevent motion of bracket 20 and limit the motion of bracket 16. It should be noted that although the screw 30 and the nut 33 are used in this embodiment, the spirit of the invention merely requires that the bracket 16 be mounted in such a manner that the point of support for the pinion gear 14, slot 15 in this embodiment, be movable over the desired range.

In FIG. 2 the shaft 17 and bushing 19 are shown with the parts associated with them. In addition to those parts referenced above, a roller 34 is mounted on the arm 23, the roller being activated to release the clutch when a pushbutton is depressed. Also, a universal joint 35 is mounted intermediate the ends of the shaft 11 for changing the angle of the axis of rotation of the second portion 11b of the shaft 11 relative to the axis of rotation of the first portion 11a.

Functionally, the shaft portion 11a can be slideably moved within the slot 12 in the front support structure 13a to accommodate a range of tuner front panel designs. Since this movement of the shaft would also affect the position of the pinion gear 14 relative to the radius of the crown gear, not only is the universal joint necessary but the supporting point for the pinion gear, slot 15 in bracket 16, must also be movable, for minimum cross cutting and gear wear. This is accomplished by having the bracket 16 pivotable. In this preferred embodiment the bracket-bushing 16, 19 rotates around a shaft 17, with its range limited by the screw 30 in the slot 31 of the bracket 16. These relationships and the range of motion are shown most clearly in FIGS. 3, 4.

The clutch release lever bracket 20 is mounted adjacent the pivotable bracket 16 and separates the actions of the bracket 16 and the clutch release assembly. The main function of the bracket 20, however, is to provide, by means of a notch 36 in a larger aperture 37 in the bracket, a retaining and pivot point for a portion of the clutch release lever 23. The coacting point for the pivoting function is a tab portion 38 of the bracket 16. The operation of the clutch release mechanism will not be described further as it is well known in the art. As is shown most clearly in FIGS. 3, 4, the pinion gear 14 can be positioned along the radius of the crown gear 24 for all possible positions of the first portion 11a of the shaft 11. Since cross-cutting of the gear teeth is thus prevented, the teeth of the crown gear can be made wider. These two factors result in added dependability and longer life for the gear drive and, thus, the entire tuner assembly.

The capability of adjusting the pinion gear support bracket 16 means that the entire clutch assembly, clutch release mechanism (except for the roller), crown gear, pinion gear bracket, the pinion gear and its shaft 11b can be preassembled and installed as a module on the production line. In prior art, the bracket was fastened in place, then the remainder of the assembly added piece by piece.

I claim:

1. A radio tuner assembly having a support structure, tuning means mounted on the support structure for selecting a desired station, and tuning drive means adapted to position the tuning means by manual or by pushbutton means, the tuning drive means comprising:
   first shaft means rotatably and slideably mounted on the support structure and including a pivot means intermediate the ends of the shaft means for changing the angle of the axis of rotation of a first portion of the shaft means relative to the axis of rotation of a second portion;
   manual control means fixedly mounted on the second portion of the shaft means for causing rotation of the latter;
   second shaft means rotatably mounted on the support structure;
   first gear means mounted on a portion of the second shaft means;
   second gear means fixedly mounted on the free end of the first portion of the first shaft means for rotation therewith, the second gear means being adapted to cause rotation of the first gear means; and
   guide bracket means pivotably mounted on the support structure for cooperating with the pivot means of the first shaft means to position the axis of the second gear means in radial alignment with the first gear means.

2. A radio tuner assembly according to claim 1 wherein the guide bracket means is pivotable around the axis of rotation of the second shaft means.

3. A radio tuner assembly according to claim 1, the tuning drive means further including; clutch means mounted on the second shaft means for transmitting the rotational motion of the manual control means to the tuning means, and declutch means for disengaging the clutch means, the declutch means actuated by depression of the pushbutton means.

4. A radio tuner assembly according to claim 3 wherein the declutch means includes a lever arm, a roller assembly mounted on a first end of the lever arm for actuation by the pushbutton means, a forked second end for deactivating the clutch means, and pivot means intermediate the ends of the lever arm.

5. A radio tuner assembly according to claim 4 wherein a portion of the guide bracket means forms a part of the pivot means of the declutch lever arm, independent of the location of the guide bracket means.

6. A radio tuner assembly having a support structure, tuning means mounted on the support structure for selecting a desired station, and tuning drive means adapted to position the tuning means by manual or by pushbutton means, the tuning drive means comprising:
   first shaft means rotatably and slideably mounted on the support structure and including a pivot means intermediate the end of the shaft means for changing the angle of the axis of rotation of a first portion of the shaft means relative to the axis of rotation of a second portion;
   manual control means fixedly mounted on the second portion of the shaft means for causing rotation of the latter;
   second shaft means rotatably mounted on the support structure;
   first gear means mounted on a portion of the second shaft means;
   second gear means fixedly mounted on the free end of the first portion of the first shaft means for rotation therewith, the second gear means being adapted to cause rotation of the first gear means; and
   guide bracket means pivotably mounted on the support structure and having a first slot for receiving the first portion of the first shaft means intermediate the pivot means and the second gear means;
   and wherein the pivot means of the first shaft means has a predetermined location for each one of a range of front panel configurations, and the slot in the guide bracket means is locatable in alignment with a line intersecting the axis of rotation of the first gear means and the pivot point of the pivot means of the first shaft means.

7. A tuner assembly according to claim 6, the guide bracket means of the tuning drive further including locking means comprising screw means and a nut for cooperating with a second slot in the guide bracket means to position the latter.

* * * * *